(12) United States Patent
Baik

(10) Patent No.: US 8,833,972 B2
(45) Date of Patent: Sep. 16, 2014

(54) ALL IN ONE SNOW CRYSTAL-SHAPED LED MODULE

(71) Applicant: Seong Gon Baik, Goyang-si (KR)

(72) Inventor: Seong Gon Baik, Goyang-si (KR)

( * ) Notice: Subject to any disclaimer, the term of this patent is extended or adjusted under 35 U.S.C. 154(b) by 112 days.

(21) Appl. No.: 13/712,914

(22) Filed: Dec. 12, 2012

(65) Prior Publication Data

US 2013/0148356 A1 Jun. 13, 2013

(30) Foreign Application Priority Data

Dec. 12, 2011 (KR) .................. 10-2011-0133290

(51) Int. Cl.
*F21S 4/00* (2006.01)
*F21K 99/00* (2010.01)
*H05K 1/02* (2006.01)
*F21V 21/00* (2006.01)
*F21W 121/00* (2006.01)
*F21Y 101/02* (2006.01)

(52) U.S. Cl.
CPC .. *F21S 4/00* (2013.01); *F21V 21/00* (2013.01); *F21K 9/90* (2013.01); *F21W 2121/006* (2013.01); *F21Y 2101/02* (2013.01); *H05K 1/028* (2013.01); *H05K 2201/0909* (2013.01); *H05K 2201/091* (2013.01); *H05K 2201/10106* (2013.01); *H05K 2201/052* (2013.01)
USPC .................................................. 362/249.16

(58) Field of Classification Search
CPC ....... F21S 4/00; F21K 9/90; F21W 2121/006; F21W 2121/04; F21Y 2101/02; H05K 1/028; F21V 21/00; F21V 21/14
See application file for complete search history.

(56) References Cited

U.S. PATENT DOCUMENTS

| | | | |
|---|---|---|---|
| 8,210,697 B2 * | 7/2012 | Lohneis | 362/84 |
| 2009/0059578 A1 * | 3/2009 | Lau | 362/231 |
| 2012/0218761 A1 * | 8/2012 | Lohneis | 362/249.04 |

FOREIGN PATENT DOCUMENTS

| KR | 10-0776401 | 11/2007 |
|---|---|---|
| KR | 10-2011-0082937 | 7/2011 |

* cited by examiner

*Primary Examiner* — Bao Q Truong
(74) *Attorney, Agent, or Firm* — AKC Patents, LLC; Aliki K. Collins

(57) ABSTRACT

A straight middle LED module having a certain length and positioned at a middle portion; side LED modules which are provided at both sides of the middle LED module at a regular interval along a longitudinal direction; a middle connection portion at which the side LED modules and the middle LED module are connected and integrally formed in order for the side LED modules to be bent; and a horizontal connection portion to which a lower side of the middle LED module is connected at a regular interval along a horizontal direction, and the middle connection portion has grooves alternately formed at both sides and has a width narrower than the width of the side LED module.

2 Claims, 4 Drawing Sheets

ALL IN ONE SNOW CRYSTAL-SHAPED LED MODULE

RELATED APPLICATION

This application claims priority form Korean Patent Application No. 10-2011-0133290, filed Dec. 12, 2011 in the Korean Intellectual Property Office, which is hereby incorporated by reference in its entirety.

TECHNICAL FIELD

An embodiment of the present invention relates to an LED (Light Emitting Diode) module constituted as an LED mounted on a FPCB (Flexible Printed Circuit Board) having a flexible substrate, and in particular to an LED module in which defective products can be minimized while simplifying a work process and enhancing productivity in such a way to remove welding processes during the manufacture of a snow crystal-shaped LED module.

BACKGROUND ART

An LED module is generally used for the purposes of advertisement, lighting and electronic parts. In particular, the snow crystal-shaped module is widely used in the winter season because it attracts a great attention from people and it is widely used for the purpose of advertisements.

When manufacturing the snow crystal-shaped LED module, the products are manufactured in such a way that the conventional rod type LED modules are welded by a skilled welding worker. The welding processes are generally conducted about 80 times.

The above-described conventional method needs a lot of welding processes, which requires a lot of time and skilled workers. When the conventional LED modules are used long, the welded portions might be destroyed and disconnected, which results in errors in operation.

SUMMARY

Accordingly, an embodiment of the present invention is made to address the problems encountered in the conventional art. It is an aspect of the present invention to manufacture a LED module featuring connection portions between LED modules that are integrated in such a way that they can be freely bent without using a welding process.

The above-described method features a work process that is quite simple, and features electric power that can be connected between the LED modules while making sure that a manufacture cost is low because a welding process is not used.

To achieve the above aspect, there is provided a snow crystal-shaped integral LED module including a straight LED module that a LED is mounted on a FPCB having flexibility at its center, and a plurality of side LED modules are provided at both sides, and a groove is alternately formed at both sides to make sure that a straight LED module and a side LED module can be easily bent, so the connection portions formed narrower than the width of the side LED module are integrated.

A plurality of straight LED modules are provided and horizontally connected at the end portions of the lower sides of the LED modules.

Since the LED modules are connected in a snow crystal shape when manufacturing the LED modules, the manufacture process becomes simple, and the manufacture cost can be reduced.

The foregoing and other aspects will become apparent from the following detailed description when considered in conjunction with the accompanying drawing figures.

An embodiment of the present invention is directed to manufacturing an integrated structure of LED modules without welding the connection portions of the LED modules, so they can be freely bent, and the electric power is connected between them without using a welding process, the work process becomes simple and the manufacture cost can be saved, and the defects can be minimized at the welded portions even though the product is used long.

BRIEF DESCRIPTION OF DRAWINGS

FIG. 2b is a detailed view illustrating portion A of FIG. 2a.

FIG. 3a is a view illustrating an open state of the side LED modules of FIG. 2a.

FIG. 3b is a detailed view illustrating portion B of FIG. 3a.

DETAILED DESCRIPTION

Figure 1:
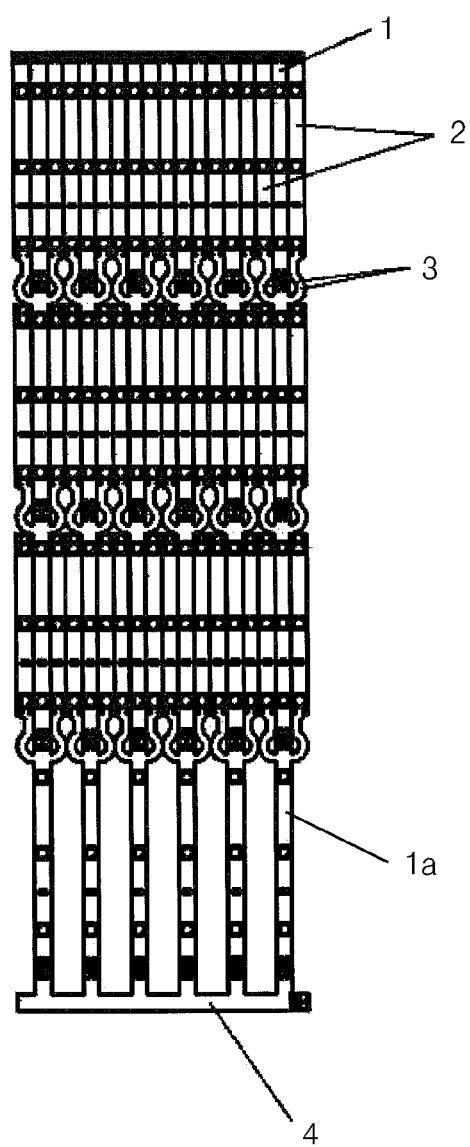
FIG. 1 is a view illustrating a snow crystal-shaped integral LED module according to an embodiment of the present invention in a pre-use state.

Reference will now be made in detail to exemplary embodiments of the present invention, examples of which are illustrated in the accompanying drawings, wherein like reference numerals refer to the like elements throughout. The exemplary embodiments are described below to explain the present invention by referring to the figures.

As used in the description of this application, the terms "a", "an" and "the" may refer to one or more than one of an element (e.g., item or act). Similarly, a particular quantity of an element may be described or shown while the actual quantity of the element may differ. The terms "and" and "or" may be used in the conjunctive or disjunctive sense and will generally be understood to be equivalent to "and/or". References to "an" or "one" embodiment are not necessarily all referring to the same embodiment. Elements from an embodiment may be combined with elements of another. No element used in the description of this application should be construed as critical or essential to the invention unless explicitly described as such. Further, when an element is described as "connected," "coupled," or otherwise linked to another element, it may be directly linked to the other element, or intervening elements may be present.

FIG. 1 is a view illustrating a snow crystal-shaped integral LED module according to an embodiment of the present invention in a pre-use state.

Figure 2A:
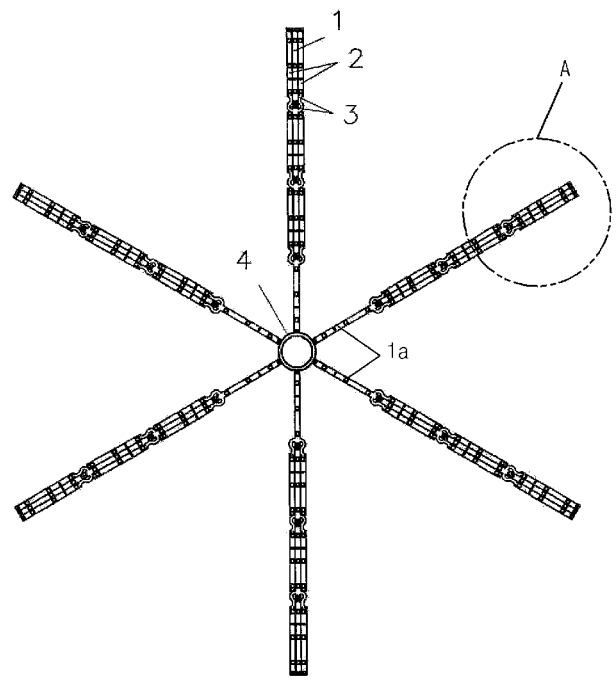
FIG. 2a is a view illustrating a state that a middle LED module and a side LED module are exploded by bending in a circular shape the horizontal connection portion of the lower side of the snow crystal-shaped integral LED module of FIG. 1.
Figure 2B:
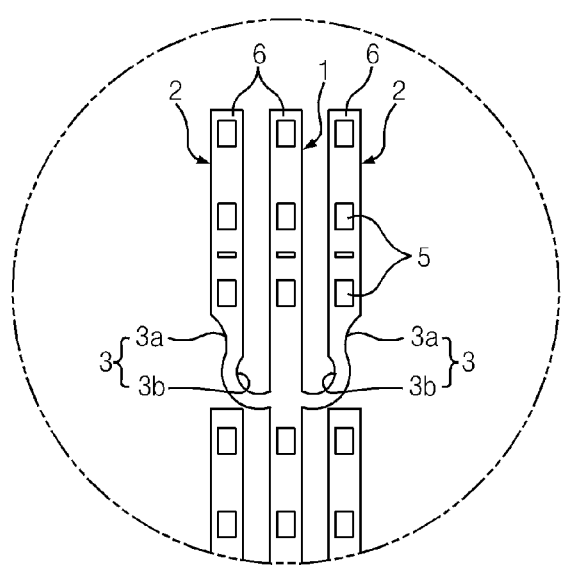
Figure 3A:
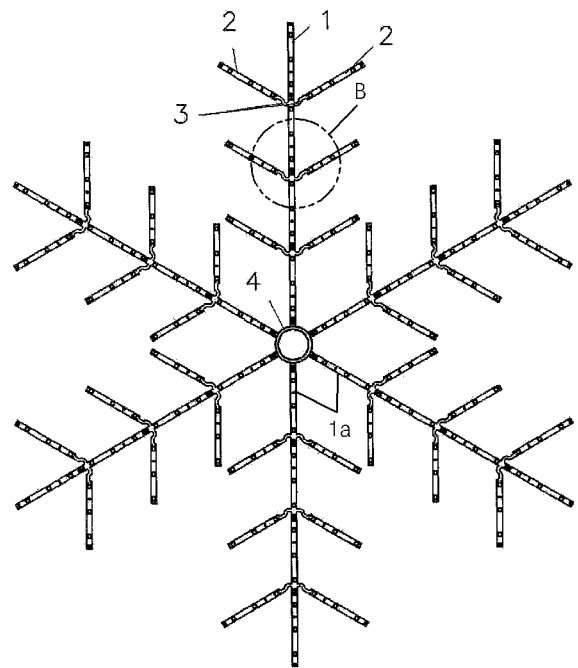
Figure 3B:
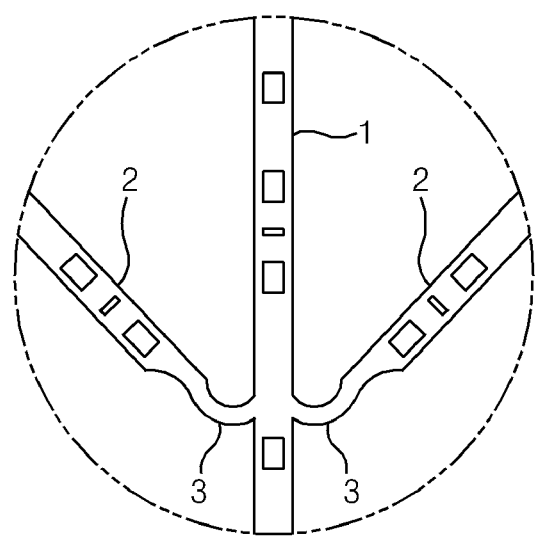
Figure 4:
FIG. 4 is a vertical cross sectional view illustrating a straight middle LED module according to an embodiment of the present invention.

FIG. 2a is a view illustrating a state that a middle LED module 1 and a side LED module 2 may be exploded by bending in a circular shape the horizontal connection portion 4 of the lower side of the snow crystal-shaped integral LED module of FIG. 1. FIG. 2b is a detailed view illustrating portion A of FIG. 2a. FIG. 3a is a view illustrating an open state of the side LED modules 2 of FIG. 2a. FIG. 3b is a detailed view illustrating portion B of FIG. 3a. FIG. 4 is a vertical cross sectional view illustrating a straight middle LED module 1 according to an embodiment of the present invention.

As shown therein, the snow crystal-shaped integrated LED module according to an embodiment of the present invention is directed to a LED modulating module that may feature an LED 5 that is mounted on a FPCB 6 and that may comprise a straight middle LED module 1 having a certain length and positioned at a middle portion, a side LED module 2 which may be provided at a regular interval at both sides of the middle LED module 1 along a longitudinal direction, a middle connection portion 3 which may correspond to a portion where the side LED module 2 and the middle LED module 1 are connected, and which may be integral so that the side LED module 2 can be easily bent, and a horizontal connection portion 4 to which may be connected at a regular interval the lower side of the middle LED module 1.

In the above described construction, the middle connection portion 3 may be narrower than the width of the side LED module 2 to make sure that the portion between the middle LED module 1 and the side LED module 2 can be easily bent. For this as shown in FIG. 2b, the grooves 3a and 3b may be alternately formed at both sides of the middle connection portion 3 at the lower side of the side LED module 2.

In addition, the straight middle LED module 1 according to an embodiment of the present invention may be positioned at the center and a plurality of the straight side LED modules 2 may be provided at both sides of the middle LED module 1.

The lower side of each straight LED module 1 may be integrally connected with the horizontal connection portion 4, and the horizontal connection portion 4 may be bent in a circular shape. When it is bent in a circular shape, the straight middle LED module 1 attached to the horizontal connection portion 4 may be bent together. In this state, as the side LED modules 2 connected to the middle LED module 1 are exploded, a snow crystal shape can be obtained when viewing in whole.

When one snow crystal shape is obtained, the LED modules are integrally connected with each other, the manufacture process becomes simple, and manufacture cost can be reduced.

The procedure that the thusly manufactured LED modules are exploded in a snow crystal shape will be described. When bending the horizontal connection portion 4 in a circular shape, the straight middle LED modules 1 positioned at the upper side may be exploded with certain intervals about the circle.

At this time, when the side LED modules 2 provided at the lateral surface of the straight middle LED module 1 are exploded, a snow crystal shape can be obtained.

In other words, the middle connection portion 3 connecting the straight middle LED module 1 and the side LED module 2 may be bent in a lateral direction, thus producing a snow crystal shape.

The middle connection portion 3 may be formed thinner than the width of the side LED module 2, so it can be flexibly bent at a higher angle.

When manufacturing the LED module in a snow crystal shape, the integrally connected LED modules are manufactured, the manufacture process becomes simple, and the manufacture cost can be reduced.

Although embodiments of the present invention have been shown and described, it would be appreciated by those skilled in the art that changes may be made in these embodiments without departing from the principles and spirit of the invention, the scope of which is defined in the claims and their equivalents.

The invention claimed is:

1. A snow crystal-shaped integral LED (Light Emitting Diode) module including LEDs mounted on a FPCB (Flexible Printed Circuit Board) having flexibility, comprising:
   a straight middle LED module having a certain length and positioned at a middle portion;
   side LED modules which are provided at both sides of the middle LED module at a regular interval along a longitudinal direction;
   a middle connection portion which at which the side LED modules and the middle LED module are connected and integrally formed in order for the side LED modules to be bent; and
   a horizontal connection portion to which a lower side of the middle LED module is connected at a regular interval along a horizontal direction, and the middle connection portion has grooves alternately formed at both sides and has a width narrower than the width of the side LED modules.

2. The snow crystal-shaped integral LED module of claim 1, wherein the horizontal connection portion is bent in a circular shape so that the straight middle LED modules can be arranged in a radial shape.

* * * * *